United States Patent [19]

Forrester

[11] 4,399,418

[45] Aug. 16, 1983

[54] LASER MODULATOR

[75] Inventor: Howard M. Forrester, Ridgecrest, Calif.

[73] Assignee: The United States of America as represented by the Secretary of the Navy, Washington, D.C.

[21] Appl. No.: 72,732

[22] Filed: Sep. 4, 1979

[51] Int. Cl.³ .............................................. H03K 17/00
[52] U.S. Cl. ..................................... 332/7.51; 372/44; 372/75; 372/81; 372/26; 372/10
[58] Field of Search .............. 332/7.51, 9 T; 307/312, 307/252 C, 253; 315/241 R; 331/94.5 S, 94.5 H

[56] References Cited

U.S. PATENT DOCUMENTS

| | | | |
|---|---|---|---|
| 3,343,046 | 9/1967 | Ladd | 307/252 C |
| 3,343,104 | 9/1967 | Motto | 307/252 C |
| 3,371,232 | 2/1968 | Hannan et al. | 307/312 |
| 3,504,302 | 3/1970 | Fenner | 332/7.51 |
| 3,628,048 | 12/1971 | Lee et al. | 307/312 |
| 3,648,073 | 3/1972 | Sams et al. | 307/312 |
| 3,806,762 | 4/1974 | Punis et al. | 332/7.51 |
| 3,867,651 | 2/1975 | Wojslawowicz | 307/252 C |
| 3,924,536 | 12/1975 | Dick et al. | 307/312 |
| 3,962,591 | 6/1976 | Popka | 307/264 |
| 3,973,167 | 8/1976 | Walters et al. | 315/240 |
| 4,158,151 | 6/1979 | Grundler | 307/312 |

FOREIGN PATENT DOCUMENTS

| | | | |
|---|---|---|---|
| 2237336 | 2/1975 | France | 331/94.5 PE |
| 613462 | 6/1978 | U.S.S.R. | 331/94.5 PE |

Primary Examiner—Nelson Moskowitz
Attorney, Agent, or Firm—R. F. Beers; W. Thom Skeer

[57] ABSTRACT

An expendable laser modulator uses high "Q" components with stripline fabrication techniques to achieve short pulses. Reverse connected diodes, one of which is a laser diode charge and discharge a pair of capacitors via a semiconductor switch which disconnects the charging voltage source during discharge.

4 Claims, 2 Drawing Figures

LASER MODULATOR

BACKGROUND OF THE INVENTION

1. Field of the Invention

This invention pertains to the field of solid state physics. More particularly, the invention pertains to a solid state, pulsed modulator. By way of further characterization, the invention pertains to a laser modulator for use in a missile system.

2. Description of the Prior Art

Laser modulators are known in which capacitor discharges determine the firing times and energies of the lasing element. Such systems produce satisfactory pulses for many purposes, however to achieve the short pulses required for high-PRF, high-resolution target definition used in missile guidance, auxiliary switches and pulse processors are required. The extra components cause the cost, size, and weight of the modulator to be increased to the determent of use in an expendable missile system.

SUMMARY OF THE INVENTION

The invention provides for the charging of a plurality of short-lead, high-"Q" capacitors through a diode, which bypasses the laser diode. A diode-clamped switch blocks the charging source of potential during discharge to prevent pulse elongation or pulse slope changes. Discharge is controlled by triggered silicon-controlled rectifiers, SCRs.

Accordingly, it is an object of the present invention to provide an improved modulator for solid-state laser sources.

A further object is to provide a short-pulse, fast-rise time current pulse modulator.

Yet another object is the provision of a low-cost, expendable source of pulsed laser energy for an expendable missile system.

Other objects of this invention will become apparent from the following detailed descriptions of the preferred embodiments and mode of operation when taken in conjunction with the appended claims.

DESCRIPTION OF THE PREFERRED EMBODIMENTS

Figure 1:
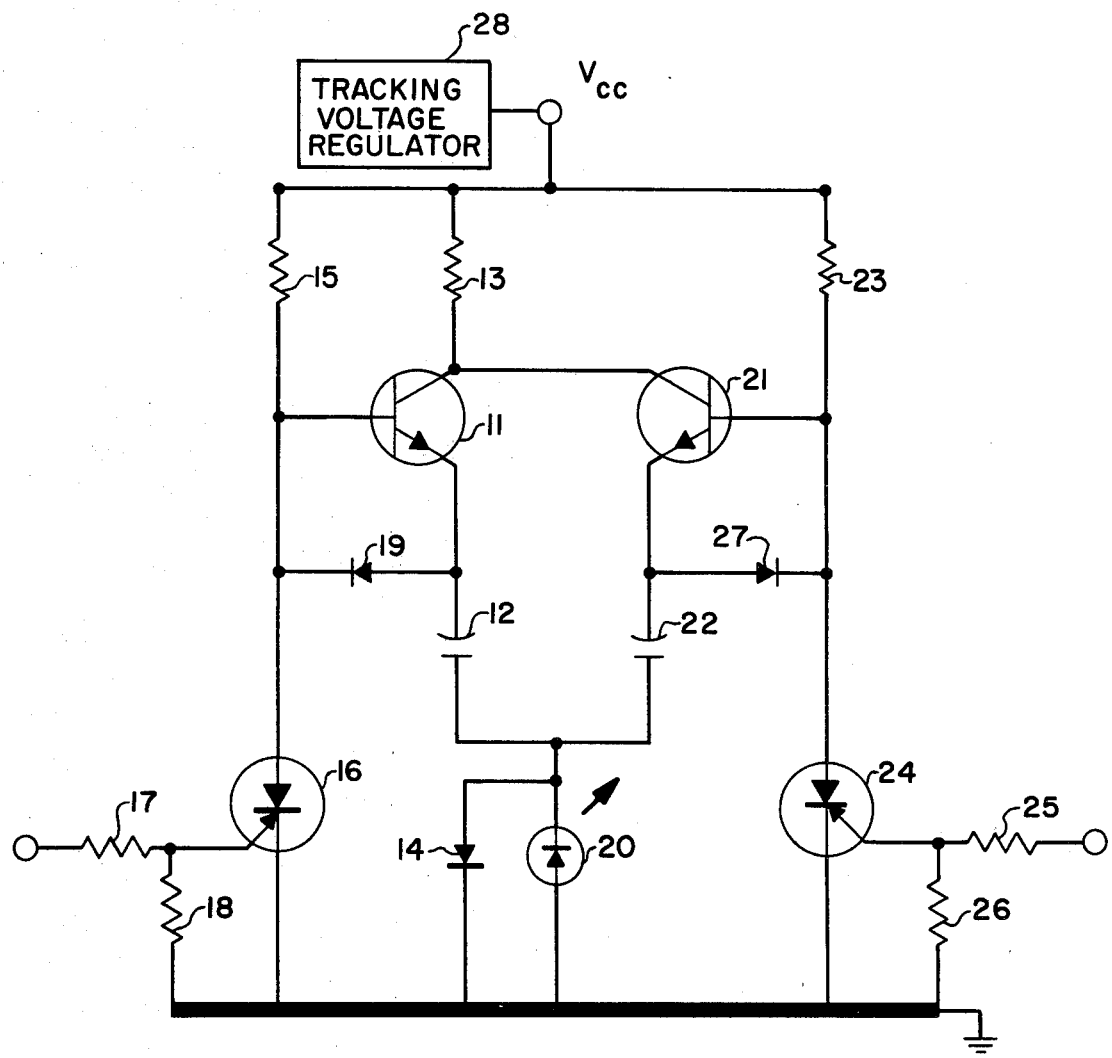
FIG. 1 is a schematic diagram of the modulator of the invention.

Referring to FIG. 1, a solid state device 11 charges capacitor 12 to a predetermined voltage, $V_{cc}$, through a resistor 13 and a diode 14. When the capacitor 12 has reached the charged voltage $V_{cc}$, the base-emitter voltage of semi-conductor 11 is reduced to a value which causes the semi-conductor to shut off to prevent further charging. The value at which semi-conductor 11 shuts off is determined by the electrical characteristics of semi-conductor 11 and the bias impressed upon the gate by a resistor 15 connected between the gate and the source of charging voltage, $V_{cc}$.

The discharge of capacitor 12 is controlled by a silicon controlled rectifier, SCR 16, upon receipt of a pulse signal across a voltage divider comprised of resistors 17 and 18 connected to the gate thereof.

SCR 16 is connected to capacitor 12 by a diode 19 and a laser diode 20. The current flow through laser diode 20 causes the desired emission of a laser pulse. Diode 19 additionally serves as a clamp diode to keep semi-conductor 11 in the cut-off state by the development of a voltage drop across during the discharge of capacitor 12. This cut-off prevents the power supply from supplying power to the discharge and thereby elongating the current flow pulse through laser diode 20.

In order to minimize the discharge time and to reduce induction loses which delateriously affect the pulse width, the current supply to laser diode 20 is duplicated by a semi-conductor device 21 corresponding to semiconductor 11 and a capacitor 22 which corresponds to capacitor 12. Similarly, SCR 24 and voltage divider comprised of resistors 25 and 26 correspond SCR 16 and the voltage divider provided by resistor 17 and 18. Diode 27 serves the same function in the charge-discharge circuitry of capacitor 22 that diode 19 serves in the charge-discharge path of capacitor 12. Resistor 23 provides the gate voltage for semi-conductor 21 in a similar fashion to resistor 15, previously described. The paralleling of charging capacitors 12 and 22 permits a high peak current and a very low time constant which is desired in the extremely narrow pulse widths with which laser diode 20 is modulated.

The time constant is minimized by component selection in which capacitors 12 and 22 are of the high "Q" disc type, such as that designated as type HYK by the Sprague Corporation. Additionally, by using printed circuit techniques and keeping the the lead lengths of the various components a minimum further inductive losses are prevented which detract from the desired fast rise time and short pulse duration. For the high-frequency applications, stripline construction techniques are used as indicated by the heavy ground plane shown in FIG. 1.

Uniformity of operation may be enhanced by supplying the voltage $V_{cc}$ from a tracking voltage regulator having conventional construction indicated at 28.

It is often desired to supply the synchronizing pulses to SCRs 16 and 24 by logic devices such as used in expendible missile fuse systems. These systems require protection from voltage transients in excess of their operating range.

Figure 2:
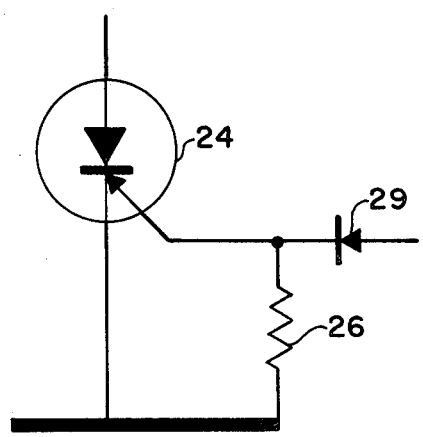
FIG. 2 is a schematic diagram of an alternative drive arrangement.

Referring to FIG. 2, one such arrangement is illustrated wherein resistor 25 is replaced with a diode 29. Of course, in such an alternative embodiment, resistor 17 would also be replaced with a coupling diode. The coupling diodes prevent transient voltage pulses from affecting the trigger circuit when such a circuit may be damaged by excessive voltage.

Diode 29 may be of the same general configuration and type as represented by diodes 19 and 27 and, in developmental models, were type IN 914. Similarly, semi-conductor devices 11 and 21 may be of conventional type such as designated by the descriptor MJ 420. Laser diode 20 may be a TA-7527X marketed by the Radio Corporation of America.

Of course, selection of the various components is made in accordance with good engineering design practice in consideration of such conventional trade-offs as price, size and electrical characteristics.

The foregoing description taken together with the appended claims constitute a disclosure such as to enable persons skilled in the electronics and electro-optic arts and having the benefit of the teachings contained therein to make and use the invention. Further, the structure herein described meets the objects of invention, and generally constitutes a meritorious advance in the art unobvious to such a skilled worker not having the benefit of these teachings.

What is claimed is:

1. A pulsed laser system comprising:

a stripline circuit including a ground plane electrode;

a two-terminal laser diode having one terminal connected to said ground plane electrode;

first and second two-terminal, low-inductance, disc-type capacitors each having one terminal thereof connected to the other terminal of said laser diode;

a reverse-connected diode connected in parallel with said laser diode to provide a charging path for said first and second capacitors;

first and second charging transistors each having an emitter connected to the other terminal of said first and second charging transistors each having a collector effectively connected to a source of charging potential;

said first and second charging transistors each having a base effectively connected to said source of charging potential via first and second bias resistors, respectively;

first and second clamp diodes connected between the junction of said first and second emitter/capacitor and said first and second base respectively; and first and second discharge switches connected between said first and second bases and said ground plane electrode for discharging said first and second capacitors through said laser diode to produce a laser light pulse.

2. A pulsed laser system according to claim 1 wherein said first and second discharge switches are first and second silicon controlled rectifiers, respectively.

3. A pulsed laser system according to claim 2 wherein said silicon controlled rectifiers are connected to receive trigger signals by first and second resistor voltage dividers, respectively.

4. A pulsed laser system according to claim 2 wherein said first and second silicon controlled rectifiers are connected to receive trigger signals by first and second coupling diodes respectively.

* * * * *